United States Patent
Kim

(10) Patent No.: US 12,188,986 B2
(45) Date of Patent: Jan. 7, 2025

(54) APPARATUS AND METHOD FOR DIAGNOSING A BATTERY

(71) Applicant: LG Energy Solution, Ltd., Seoul (KR)

(72) Inventor: Young Jin Kim, Daejeon (KR)

(73) Assignee: LG Energy Solution, Ltd., Seoul (KR)

(*) Notice: Subject to any disclaimer, the term of this patent is extended or adjusted under 35 U.S.C. 154(b) by 192 days.

(21) Appl. No.: 17/764,728

(22) PCT Filed: Apr. 26, 2021

(86) PCT No.: PCT/KR2021/005267
§ 371 (c)(1),
(2) Date: Mar. 29, 2022

(87) PCT Pub. No.: WO2021/230533
PCT Pub. Date: Nov. 18, 2021

(65) Prior Publication Data
US 2022/0341997 A1    Oct. 27, 2022

(30) Foreign Application Priority Data
May 15, 2020  (KR) ............ 10-2020-0058587

(51) Int. Cl.
*G01R 31/367* (2019.01)
*G01R 31/36* (2020.01)
(Continued)

(52) U.S. Cl.
CPC ....... *G01R 31/367* (2019.01); *G01R 31/3648* (2013.01); *G01R 31/374* (2019.01); *G01R 31/385* (2019.01)

(58) Field of Classification Search
CPC .............. G01R 31/367; G01R 31/3648; G01R 31/374; G01R 31/385
(Continued)

(56) References Cited

U.S. PATENT DOCUMENTS

| 9,707,855 B1 | 7/2017 | Wang et al. |
| 2008/0125932 A1 | 5/2008 | Yamabe et al. |

(Continued)

FOREIGN PATENT DOCUMENTS

| JP | 4165268 B2 | 10/2008 |
| JP | 5102483 B2 | 12/2012 |

(Continued)

OTHER PUBLICATIONS

Extended European Search Report including Written Opinion for Application No. 21803320.7 dated Nov. 7, 2022, pp. 1-8.
(Continued)

*Primary Examiner* — Ricky Go
(74) *Attorney, Agent, or Firm* — Lerner David LLP

(57) ABSTRACT

An apparatus which diagnoses a battery by detecting an abnormal voltage drop phenomenon of a battery cell includes a voltage measuring circuit, a current measuring circuit, a voltage estimating circuit, and a control circuit. The voltage measuring circuit measures a voltage across both terminals of a battery cell. The current measuring circuit measures the current flowing through either terminal of a battery cell. The voltage estimating circuit, based on current and a status estimation model, calculates an estimated voltage level. The diagnostic circuit calculates a voltage level difference between a voltage level measured by the voltage measuring circuit and an estimated voltage level, and, based on the voltage level difference and a reference value, determines whether or not an error has occurred in the battery cell. The control circuit includes a control circuit which, according to an estimation accuracy of the estimated voltage level, adjusts a reference value.

15 Claims, 11 Drawing Sheets

(51) Int. Cl.
*G01R 31/374* (2019.01)
*G01R 31/385* (2019.01)

(58) Field of Classification Search
USPC .......................................................... 702/63
See application file for complete search history.

(56) References Cited

U.S. PATENT DOCUMENTS

| | | |
|---|---|---|
| 2009/0189613 A1 | 7/2009 | Plett |
| 2011/0257916 A1 | 10/2011 | Plett |
| 2014/0361743 A1* | 12/2014 | Lin .................. B60L 58/15 |
| | | 320/109 |
| 2015/0046108 A1 | 2/2015 | Akamine |
| 2015/0285867 A1 | 10/2015 | Wang et al. |
| 2016/0131716 A1 | 5/2016 | Takashima et al. |
| 2016/0259011 A1 | 9/2016 | Joe |
| 2017/0123009 A1 | 5/2017 | You et al. |
| 2017/0176540 A1 | 6/2017 | Omi et al. |
| 2020/0182937 A1* | 6/2020 | Wampler .................. B60L 3/12 |
| 2020/0355749 A1* | 11/2020 | Takahashi ........... G01R 31/367 |
| 2021/0055352 A1 | 2/2021 | Takahashi et al. |
| 2021/0239762 A1* | 8/2021 | Zhang ................ H01M 10/486 |

FOREIGN PATENT DOCUMENTS

| | | |
|---|---|---|
| JP | 2013072677 A | 4/2013 |
| JP | 2014182072 A | 9/2014 |
| JP | 5798067 B2 | 10/2015 |
| JP | 2018151176 A | 9/2018 |
| JP | 6421411 B2 | 11/2018 |
| JP | 2018169161 A | 11/2018 |
| JP | 6499075 B2 | 4/2019 |
| JP | 2019146302 A | 8/2019 |
| JP | 2019164969 A | 9/2019 |
| KR | 101021745 B1 | 3/2011 |
| KR | 20150043214 A | 4/2015 |
| KR | 20160128000 A | 11/2016 |
| KR | 101708885 B1 | 2/2017 |
| KR | 101930647 B1 | 3/2019 |
| KR | 101963888 B1 | 7/2019 |
| WO | 2012098968 A1 | 7/2012 |
| WO | 2015133103 A1 | 9/2015 |
| WO | 2019138286 A1 | 7/2019 |
| WO | 2019175707 A1 | 9/2019 |

OTHER PUBLICATIONS

International Search Report for PCT/KR2021/005267 dated Aug. 6, 2021. 3 pgs.

* cited by examiner $$\text{e11)} \quad \hat{A}_k = \frac{\partial f(x[k],u[k])}{\partial x_k} = \begin{bmatrix} 1 & 0 \\ 0 & \exp(-\frac{\Delta t}{R_1 C_1}) \end{bmatrix}$$

$$\text{e12)} \quad \hat{B}_k = \frac{\partial f(x[k],u[k])}{\partial u[k]} = \begin{bmatrix} \frac{\Delta t}{C} \\ R_1(1-\exp(-\frac{\Delta t}{R_1 C_1})) \end{bmatrix}$$

$$\text{e13)} \quad \hat{C}_k = \frac{\partial H(x_k,u_k)}{\partial x_k} = \begin{bmatrix} \frac{dOCV}{dSOC} & 1 \end{bmatrix}$$

$$\text{e14)} \quad Q_w = E[w[k]w[k]^T]$$

$$\text{e15)} \quad R_v = E[v[k]v[k]^T]$$

FIG.6B

APPARATUS AND METHOD FOR DIAGNOSING A BATTERY

CROSS-REFERENCE TO RELATED APPLICATIONS

The present application is a national phase entry under 35 U.S.C. § 371 of International Application No. PCT/KR2021/005267 filed Apr. 26, 2021, published in Korean, which claims priority from Korean Patent Application No. 10-2020-0058587 filed on May 15, 2020, all of which are incorporated herein by reference.

TECHNICAL FIELD

The present invention relates to an apparatus for diagnosing a battery. More specifically, the present invention relates to an apparatus which detects an abnormal voltage drop phenomenon of a battery cell to diagnose a battery.

BACKGROUND ART

In recent years, there has been active research and development into secondary batteries. Here, a secondary battery is a battery capable of charging and discharging, and includes all of conventional Ni/Cd batteries, Ni/MH batteries, etc., and the more recent lithium ion batteries. Among secondary batteries, lithium ion batteries have an advantage in that they have much higher energy density compared to conventional Ni/Cd batteries and Ni/MH batteries, etc. Lithium ion batteries can be made with light weight and a small form factor, and are used as electrical power sources for mobile devices. In particular, lithium ion batteries can be used as an electrical power source for electric vehicles, and are receiving attention as a next-generation energy storage medium.

Further, secondary batteries are generally used in the form of a battery pack comprised of battery modules in which a plurality of battery cells are connected serially and/or in parallel. The status and operation of a battery pack is controlled by a battery management system. The battery cells within a battery pack are charged with electricity from an external source.

The charged battery cells supply electrical power to various apparatuses and/or circuits connected to the battery pack. In a case where a battery cell is faulty, electrical power is not properly supplied to the various apparatuses and/or circuits, and therefore critical accidents may occur. Accordingly, a means for monitoring a battery cell during charging to diagnose whether or not the battery cell is faulty is called for.

SUMMARY

Technical Problem

The purpose of the present invention, which has been devised to solve the above-stated technical problem, is to provide an apparatus and method for diagnosing a battery by using an extended Kalman filter to detect the occurrence of an abnormal voltage drop phenomenon in a battery cell.

Solution to Problem

The apparatus for diagnosing a battery according to an embodiment of the present invention may be comprised of a voltage measuring circuit, a current measuring circuit, a voltage estimating circuit, a diagnostic circuit and a control circuit. The voltage measuring circuit may be configured to measure the voltage across both terminals of a battery cell. The current measuring circuit may be configured to measure the current flowing at either terminal of a battery cell. The voltage estimating circuit may be configured to calculate an estimated voltage level based on the measured current and a status estimation model. The diagnostic circuit may be configured to calculate a voltage level difference between a voltage level of the measured voltage and the estimated voltage level, and determine, based on the calculated voltage level difference and a reference value, whether or not an error has occurred in a battery cell. The control circuit may be configured to adjust a reference value according to an estimation accuracy of the estimated voltage level.

Advantageous Effects of Invention

The present invention is able to use an extended Kalman filter to estimate a voltage of a battery cell. The present invention, by comparing a measured voltage and an estimated voltage, is able to more accurately detect the occurrence of an abnormal voltage drop phenomenon in a battery cell. Further, the present invention, by using a sliding window method, is able to provide an apparatus for battery diagnosis which is more robust against noise.

BRIEF DESCRIPTION OF THE DRAWINGS

FIG. 6b illustrates an equation for describing a system model of an extended Kalman filter.

DETAILED DESCRIPTION

Figure 1:
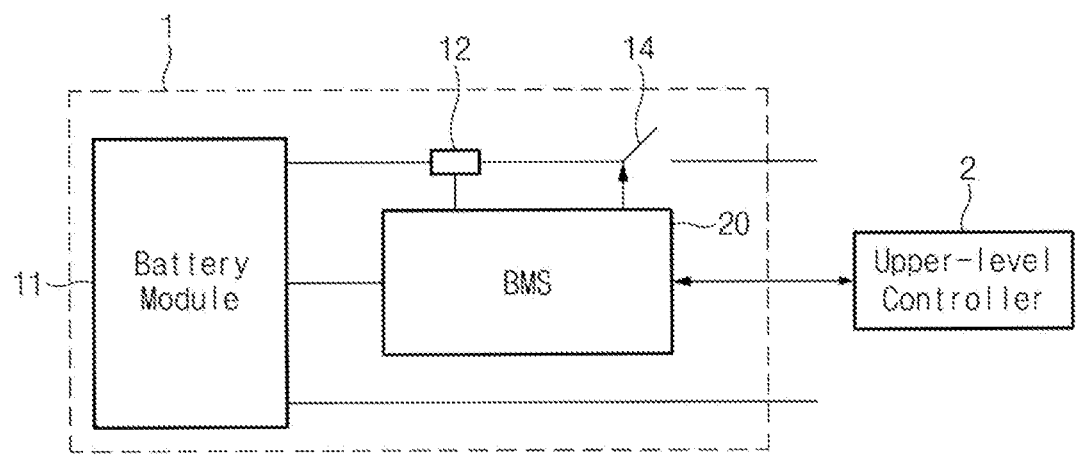
FIG. 1 is a block diagram illustrating the configuration of a battery control system.

In the following, various embodiments of the present invention will be described in detail with reference to the attached drawings. In the present document, like reference signs are used to refer to like elements in the drawings, and redundant description of like elements will be omitted.

With regard to the various embodiments of the present invention disclosed in the present document, specific structural or functional descriptions are exemplified solely for the purpose of describing embodiments of the present invention.

The various embodiments of the present invention may be carried out in various forms, and shall not be interpreted as being limited to the embodiments described in the present document.

Expressions such as "first" or "second" used in the various embodiments may describe various component elements without regard for order and/or importance, and do not limit such component elements. For example, without departing from the scope of the present invention, a first component element may be designated as a second component element, and similarly a second component element may also instead be designated as a first component element.

The terms used in the present invention are used only to describe specific embodiments, and may not be intended to limit the scope of other embodiments. Singular expressions, unless clearly intended otherwise by context, may also include plural expressions.

Including technical or scientific terms, all terms used herein may have the same meaning as that generally understood by a person having ordinary skill in the technical field of the present invention. Generally used, dictionary-defined terms may be interpreted as having identical or similar meaning as that which they have in the context of the relevant art, and unless clearly so defined in the present document, shall not be interpreted as having ideal or inordinately formal meanings. In no case may terms defined in the present document be interpreted in a manner that excludes the embodiments of the present invention.

FIG. 1 is a block diagram illustrating the configuration of a battery control system.

Referring to FIG. 1, a battery control system comprised of the battery pack (1) according to one embodiment of the present invention and an upper-level controller (2) which is included in a upper-level system are roughly illustrated.

As illustrated in FIG. 1, the battery pack (1) is comprised of at least one battery cell, and includes a chargeable and dischargeable battery module (11), a switching part (14) which is serially connected to the + terminal side or − terminal side of the battery module (11) for controlling a charge or discharge current flow of the battery module (11), and a battery management system (20) which monitors, controls and manages a voltage, current and temperature, etc. of the battery pack (1) to prevent overcharge and over discharge, etc.

Here, the switching part (14) is a switching element for controlling a current flow in the charging or discharging of the battery module (11). For example, at least one semiconductor switching element such as a MOSFET, or a relay, etc. may be used.

Further, the battery management system (20) may monitor a voltage, current, and temperature, etc. of the battery pack (1), and may measure a voltage, current, and temperature, etc. of the battery pack, using a sensor (12) provided adjacent to the switching unit (14). The battery management system (20) may, as an interface for receiving input of measured values of the various parameters stated above, include a plurality of terminals, and circuits which are connected to these terminals and which carry out processing of input values received.

Further, the battery management system (20) may control the ON/OFF of the switching unit (14), for example a MOSFET or relay, and may be connected to the battery module (11) to monitor the status of the battery module (11).

The upper-level controller (2) may transmit a control signal for the battery module (11) to the battery management system (20). Accordingly, the operation of the battery management system (20) may be controlled based on a signal transmitted from the upper-level controller (2). The battery cell of the present invention may be an element included in an ESS (Energy Storage System) or a battery pack used in an automobile, etc. Provided, that the battery cell is not limited to such uses.

As the configuration of the battery pack (1) and configuration of the battery management system (20) are known configurations, more specific description will be omitted.

Figure 2:
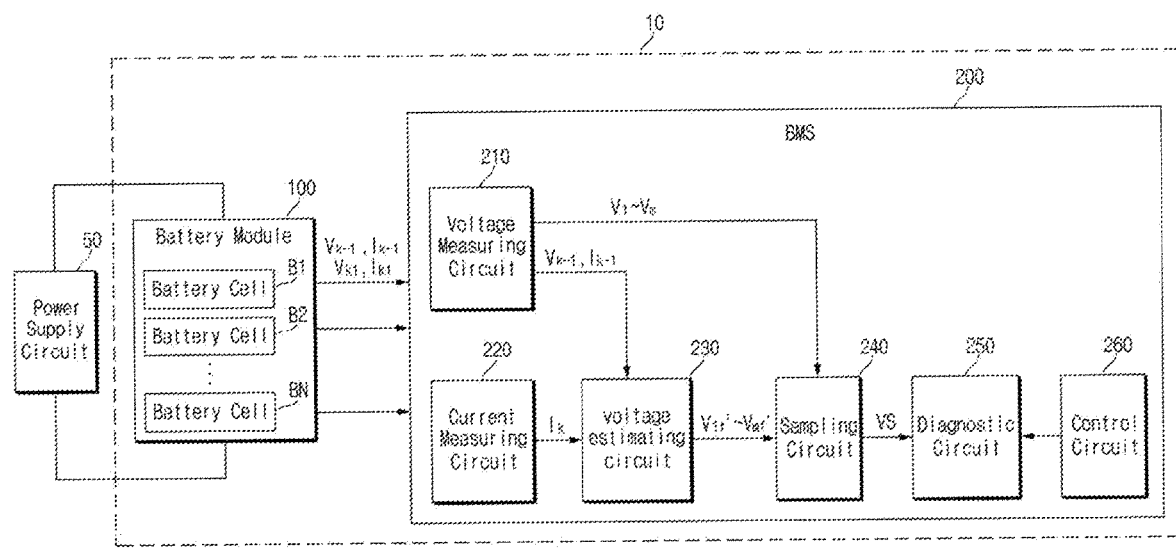
FIG. 2 is a block diagram illustrating the configuration of a battery pack comprising the apparatus for diagnosing a battery of the present invention.

FIG. 2 is a block diagram illustrating the configuration of a battery pack (10) comprising the apparatus for diagnosing a battery of the present invention. The battery module (100) and battery management system (200) of FIG. 2 may correspond to the battery module (11) and battery management system (20) of FIG. 1.

The battery pack (10) may include a battery module (100) and a battery management system (200). In the following descriptions, "battery diagnostic apparatus" may be an apparatus which includes part of or all of the elements of the battery management system (200). For example, "battery diagnostic apparatus" may include a voltage measuring circuit (210), a current measuring circuit (220), a voltage estimating circuit (230), a diagnostic circuit (250) and a control circuit (260).

The battery module (100) may include a plurality of battery cells (B1-BN). The plurality of battery cells (B1-BN) may be connected serially or in parallel. Referring to FIG. 2, whereas the battery pack (10) is illustrated as including a single battery module (100), the present invention is not limited hereto, and the battery pack (10) may include one or more battery modules.

In the charging period, the battery module (100) may be supplied with electric power from a power supply circuit (50). In the charging period, the voltage at either terminal of the respective battery cells (B1-BN) may increase. In the following descriptions, "battery cell voltage" refers to "voltage at either terminal of a battery cell". Due to an internal short-circuit or an external short-circuit of a battery cell, an abnormal voltage drop phenomenon may be detected. An abnormal voltage drop phenomenon refers to a sudden drop in battery cell voltage in parts of a charging period. An abnormal voltage drop phenomenon will be described in detail with reference to FIG. 3.

In a discharging period, the battery module (100) may supply electrical power to external apparatuses and/or circuits. For example, in a case where the battery module (100) is included in an electric vehicle, external apparatuses and/or circuits may be a motor, PCU (Power Control Unit), or inverter, etc.

The battery management system (200) may include a voltage measuring circuit (210), current measuring circuit (220), voltage estimating circuit (230), sampling circuit (240), diagnostic circuit (250) and control circuit (260). The battery management system (200) may, by monitoring the battery module (100), discover defects of the battery module (100), predict the replacement timing of the battery module (100), and control and manage the battery module (100). Further, the battery management system (200) may provide information on the battery module (100) to a control device or controller external to the battery pack (10).

The battery management system (200) of the present invention is able to inspect the battery cells (B1-BN) for occurrence of errors. For example, the battery management system (200), by measuring a voltage and current of a battery cell (B1) in a charging period, is able to determine whether or not an abnormal voltage drop phenomenon occurs in the battery cell (B1). In the descriptions that follow, to determine whether or not an error has occurred in a battery cell (B1) means to determine whether or not an abnormal voltage drop phenomenon has occurred in a battery cell (B1). Further, in the following descriptions, for convenience of description, a method by which a battery management system (200) inspects a battery cell (B1) will be described in focus. The battery management system (200) may inspect the other battery cells (B2-BN) in a manner identical to the method by which it inspects the battery cell (B1).

The voltage measuring circuit (210) may measure a voltage ($V_{k-1}$) of a battery cell (B1) at a first time, and a voltage ($V_k$) of the battery cell (B1) at a second time. The second time may be a time later than the first time. In a case where the voltage measuring circuit (210) measures a voltage of the battery cell (B1) at regular intervals, voltage ($V_{k-1}$) may be a voltage measured at the interval immediately previous to the interval at which voltage ($V_k$) was measured.

The current measuring circuit (220) may measure the current at one of the two terminals of a battery cell (B1). Specifically, the current measuring circuit (220) may measure a current being input into the battery cell (B1), or a current being output from the battery cell (B1). In the following descriptions, it is assumed that the current measuring circuit (220) measures a current being input into the battery cell (B1). In the following descriptions, "current of battery cell (B1)" means "current being input into battery cell (B1)". The current measuring circuit (220) may measure the current ($I_k$) of battery cell (B1) at a second time.

The voltage estimating circuit (230) may receive information on voltage ($V_{k-1}$) from the voltage measuring circuit (210), and receive information on current (I-k) from the current measuring circuit (220). The voltage estimating circuit (230) may store information regarding a status estimation model, or receive information on a status estimation model from a memory (not illustrated). For example, the status estimation model may be a recursive filter model to which an extended Kalman filter has been applied. The voltage estimating circuit (230) may, by inputting a voltage ($V_{k-1}$) into a status estimation model, calculate a predicted voltage ($V_k'$). The predicted voltage ($V_k'$) may be a voltage of the battery cell (B1) at a second time as predicted by the voltage estimating circuit (230). The voltage estimating circuit (230) may, by inputting a current ($I^-_k$) and predicted voltage ($V_k'$) into the status estimation model, calculate an estimated voltage ($V_{kf}'$). The estimated voltage ($V_{kf}'$) may be a value resulting from the voltage estimating circuit (230) receiving input of a current ($I^-_k$) and revising a predicted voltage ($V_k'$). The operations of the voltage estimating circuit (230) will be described in further detail with reference to FIG. 5.

The voltage measuring circuit (210), current measuring circuit (220) and voltage estimating circuit (230) may carry out the above operations at regular intervals. In a case where the voltage measuring circuit (210), current measuring circuit (220) and voltage estimating circuit (230) have carried out the above operations M number of times, M number of measured voltages and M number of estimated voltages may be generated, "M" is an integer or 2 or more.

A sampling circuit (240) may receive, from the voltage measuring circuit (210), information on M number of measured voltages. The sampling circuit (240) may receive, from the voltage estimating circuit (230), information on M number of estimated voltages. Voltage ($V_k$) is one of M number of measured voltages. Estimated voltage ($V_{kf}'$) is one of M number of estimated voltages. The sampling circuit (240) may calculate a voltage level difference between a voltage level of an estimated voltage ($V_{kf}'$) corresponding to a voltage ($V_k$), and a voltage level of a voltage ($V_k$). The sampling circuit (240) may carry out the above operation on the respective corresponding pairs of M number of measured voltages and M number of estimated voltages. That is, the sampling circuit (240) may calculate M number of voltage level differences from the respective pairs of M number of measured voltages and M number of estimated voltages. The sampling circuit (240) may, using a sliding window (or moving window) method, sample M number of voltage level differences. The sampling circuit (240) may, using the sliding window method, select Q number of voltage level differences from among M number of voltage level differences. "Q" is a natural number less than "M". The sampling circuit (240) may calculate a statistical value (VS) of the Q number of sampled voltage level differences. For example, the statistical value (VS) of the Q number of voltage level differences may be at least any one of the mean value, maximum value, minimum value, and standard deviation, etc., of the Q number of voltage level differences. The operations of the sampling circuit (240) will be described in detail with reference to FIG. 7.

A diagnostic circuit (250) may receive information on the statistical value (VS) from the sampling circuit (240). The diagnostic circuit (250) may compare the statistical value (VS) with a reference value. The reference value may be stored internally in or externally of the diagnostic circuit (250). The reference value may be a value for diagnosing whether or not an abnormal voltage drop phenomenon has occurred in a battery cell (B1). The reference value may be a maximum possible voltage difference between an actual voltage and estimated voltage of a battery cell (B1) in a case where an abnormal voltage drop phenomenon has not occurred in the battery cell (B1). The reference value may be preset by a user, and may be changed depending on a status of a battery cell, such as temperature or SOC.

The diagnostic circuit (250) may, in a case where the statistical value (VS) is equal to or greater than a reference value, determined that a defect has occurred in the battery cell (B1). That is, the diagnostic circuit (250) may, through the above operations, detect a rapid decrease in the voltage ($V_k$) of the battery cell (B1) in the charging period.

The diagnostic circuit (250) may count the number of times an error occurs in a battery cell (B1). The diagnostic circuit (250) may, based on the number of times counted, evaluate a status of the battery cell (B1). For example, in a case where the number of times counted is less than a first reference number of times, the battery cell (B1) may be evaluated as being in a normal status. In a case where the number of times counted is equal to or greater than a first reference number of times but is less than a second reference number of times, the battery cell (B1) may be evaluated as not being in a dangerous status but in a warning status. In a case where the number of times counted is equal to or greater than a second reference number of times, the battery cell (B1) may be evaluated as being in a dangerous status. The first reference number of times may be smaller than the second reference number of times.

The control circuit (260) may adjust the reference value depending on the estimation accuracy of the estimated voltage ($V_{kf}'$) at the voltage estimating circuit (230). The control circuit (260) may, if the estimation accuracy is high, reduce the reference value, and if the estimation accuracy is low, increase the reference value. A high estimated voltage ($V_{kf}'$) estimation accuracy means that the estimated voltage ($V_{kf}'$) has a small spread, and a low estimated voltage ($V_{kf}'$) estimation accuracy means that the estimated voltage ($V_{kf}'$) has a large spread.

Depending on the temperature of a battery cell (B1), the estimation accuracy of the estimated voltage ($V_{kf}'$) at the voltage estimating circuit (230) may vary. Specifically, if the temperature of the battery cell (B1) decreases, the spread of the estimated voltage ($V_{kf}'$) may increase. An increased spread of the estimated voltage ($V_{kf}'$) means that the estimation accuracy of the estimated voltage ($V_{kf}'$) is decreased. That is, if the temperature of the battery cell (B1) decreases, the estimation accuracy of the estimated voltage ($V_{kf}'$) may be reduced. Therefore, if the diagnostic circuit (250) uses the same reference value at a low temperature as it uses at a high temperature, it may misdiagnose whether or not an error has occurred in the battery cell (B1). The control circuit (260) may, to prevent misdiagnosis by the diagnostic circuit (250), increase the reference value if the temperature decreases, and reduce the reference value if the temperature increases.

Figure 3:
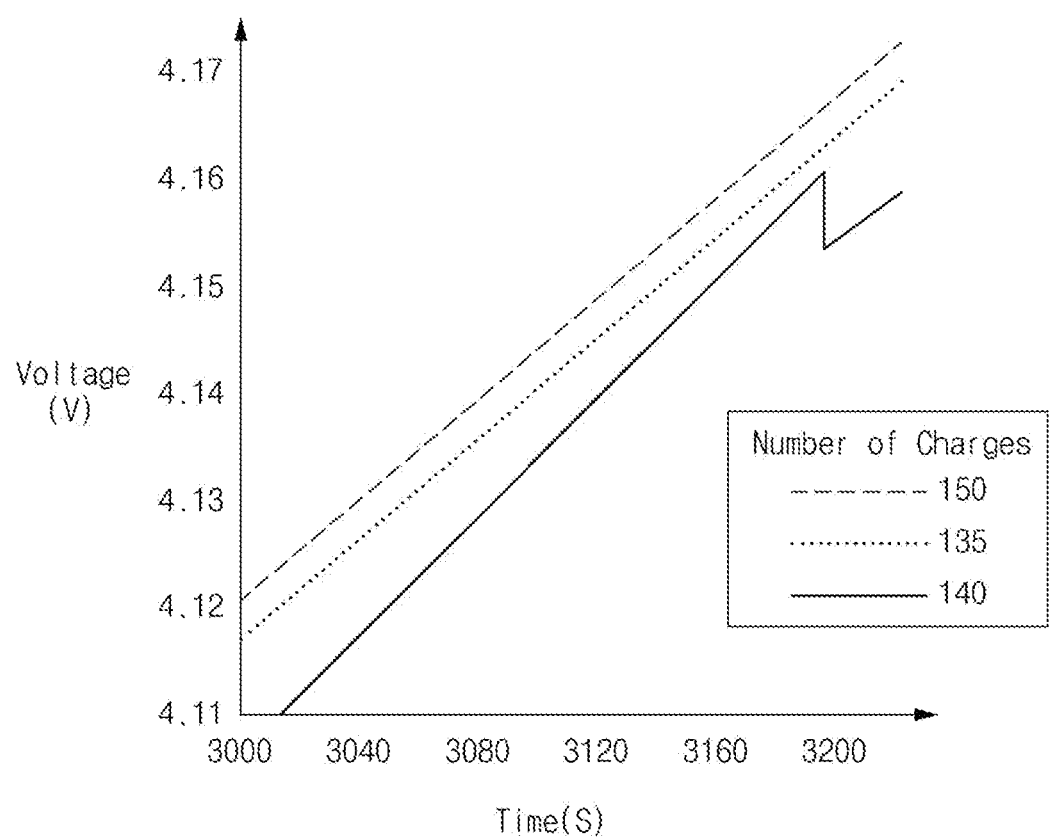
FIG. 3 is a graph illustrating a voltage change of the battery cell of FIG. 2.

FIG. 3 is a graph illustrating a voltage change of the battery cell of FIG. 2.

FIG. 3 shows part of the voltage change of a battery cell (B1) with the passage of time in a charging period when a charge-discharge test is carried out repetitively using a test battery cell (for convenience of understanding, the results of only some of the repeatedly conducted tests are illustrated). In the graph illustrated in FIG. 3, the x axis represents time, and the y axis represents voltage.

Referring to FIG. 3, in the charging period, the voltage of the battery cell (B1) increases with the passage of time. During the $140^{th}$ charge, the voltage of the battery cell (B1) momentarily decreases rapidly. Such a phenomenon is expressed as an abnormal voltage drop phenomenon. Referring to FIG. 3, in the present test, an abnormal voltage drop phenomenon appeared in the 3160-3180 seconds period of the $140^{th}$ charge cycle.

In a case where an abnormal voltage drop phenomenon occurs in a battery cell (B1), the voltage level difference between the voltage measured at the voltage measuring circuit (210) of FIG. 2 and the voltage estimated at the voltage estimating circuit (230) of FIG. 2 increases. The diagnostic circuit (250) of FIG. 2, may, based on the increasing of the voltage level difference, inspect for whether or not an abnormal voltage drop phenomenon has occurred in the battery cell (B1).

Figure 4:
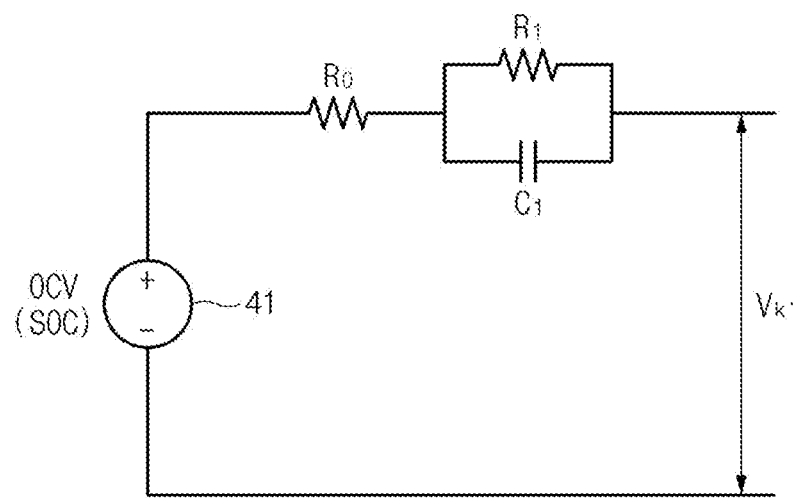
FIG. 4 is a circuit diagram illustrating a Thevenin equivalent circuit for estimating a voltage of the battery cell of FIG. 2.

FIG. 4 is a circuit diagram illustrating a Thevenin equivalent circuit for estimating a voltage of the battery cell of FIG. 2.

The Thevenin equivalent circuit (40) may be a circuit which reflects the electrical characteristics of the battery cell (B1) of FIG. 2. Based on the Thevenin equivalent circuit (40), the status variables of the extended Kalman filter used in the voltage estimating circuit (230) of FIG. 2 may be deduced. The Thevenin equivalent circuit (40) may be an element wherein a voltage source (41), resistance ($R_0$), and resistance ($R_1$)-capacitor ($C_1$) set are serially connected. Here, the resistance ($R_1$)-capacitor ($C_1$) may be an element wherein a resistance ($R_1$) and capacitor ($C_1$) are connected in parallel.

Referring to FIG. 4, whereas the Thevenin equivalent circuit (40) is illustrated as a primary circuit which includes a single resistance-capacitor set, the present invention is not limited hereto. The Thevenin equivalent circuit used in the voltage estimating circuit (230) of FIG. 2 may be a P-order circuit wherein P number of resistance-capacitor sets are serially connected. Here, "P" is a natural number.

Based on the Thevenin equivalent circuit (40), [Mathematical Equation 1] below may be deduced.

[Mathematical Equation 1]
$$V_k' = OCV(SOC) - \left(1 - e^{\frac{-t}{R_1 C_1}}\right) \times I_k \times R_1 - I_k \times R_0$$

Referring to the description relating to FIG. 2, "$V_k'$" represents the magnitude of a voltage of a battery cell (B1) at a second time as predicted by a voltage estimating circuit (230). "$I_k$" represents the magnitude of the current of the battery cell (B1) at a second time. "OCV (SOC)" represents the voltage level of a voltage source (41) depending on the State of Charge (SOC) of the battery cell (B1). Further, "$R_0$", "$R_1$", and "$C_1$" respectively represent the size of resistance ($R_0$), the size of resistance ($R_1$), and the size of the capacitor ($C_1$).

The voltage estimating circuit (230) may, based on [Mathematical Equation 1], deduce a voltage status estimation algorithm for estimating a voltage ($V_k$). First, if the sampling time Δt at a measuring time (for example, at the second time) is sufficiently small, it is assumed that the current is constant during the time interval. Then, the voltage estimating circuit (230) may, using a Taylor expansion equation (specifically, f(x)=f(x0)+f'(x0)*(x−x0)), linearize [Mathematical Equation 1], then deduce a voltage status estimation algorithm for a measuring time (for example, a second time).

The voltage status estimation algorithm is expressed as [Mathematical Equation 2].

[Mathematical Equation 2]
$$V_k' = \left(e^{-\frac{\Delta t}{R_1 C_1}}\right) V_{k-1} + R_1 \left(1 - e^{-\frac{\Delta t}{R_1 C_1}}\right) I_{k-1}$$

In [Mathematical Equation 2], referring to the description relating to FIG. 2, "$V_{k-1}$" and "$I_{K-1}$" represent the magnitude of a voltage and the magnitude of a current of a battery cell (B1) at a first time. "$R_1$" and "$C_1$" respectively represent the size of resistance ($R_1$), and the size of the capacitor ($C_1$). "Δt" represents the duration of time between the second time and the first time.

The voltage estimating circuit (230) may, based on [Mathematical Equation 2], deduce an estimated voltage ($V_{kf}'$). The operations for the voltage estimating circuit (230) to deduce an estimated voltage ($V_{kf}'$) will be described in detail with reference to FIG. 5.

Figure 5:
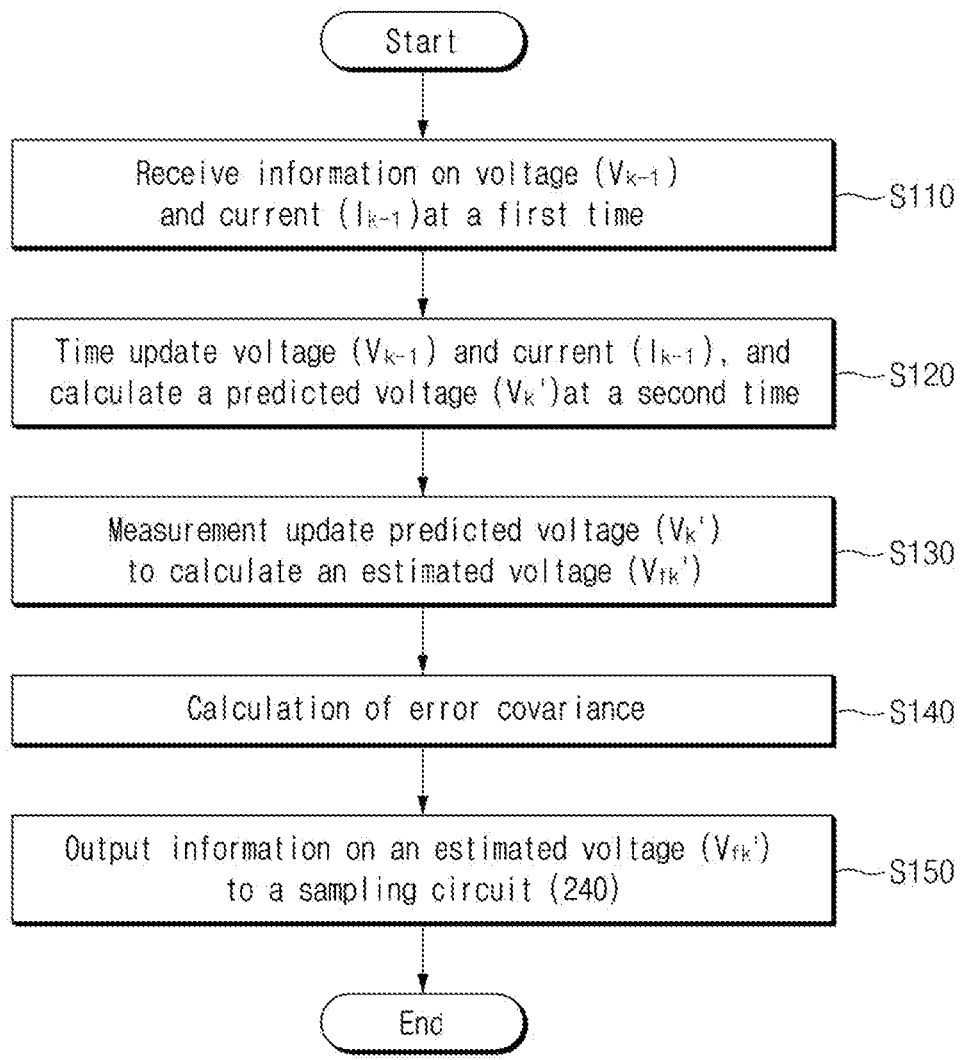
FIG. 5 is a flow diagram for describing a process by which a voltage of the battery cell is estimated in the voltage estimating circuit of FIG. 2.
Figure 6A:
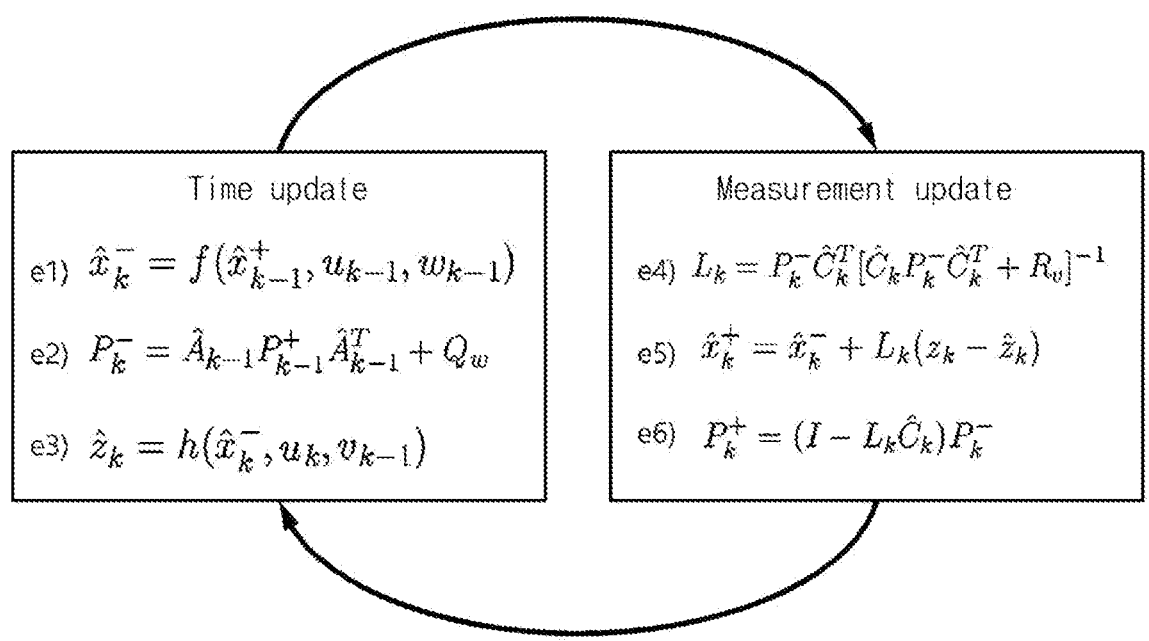
FIG. 6a illustrates a status estimation model to which an extended Kalman filter has been applied.

FIG. 5 is a flow diagram for describing a process by which a voltage of the battery cell is estimated in the voltage estimating circuit of FIG. 2. FIG. 6a illustrates a status estimation model to which an extended Kalman filter has been applied. FIG. 6b illustrates an equation for describing a system model of an extended Kalman filter. For convenience of description, FIG. 5, FIG. 6a and FIG. 6b will be described together.

Based on [Mathematical Equation 2] and the equations (e11-e15) of FIG. 6b, the equations (e1-e6) illustrated in FIG. 6a can be deduced. The equations (e1-e6) of FIG. 6a represent mathematical equations used in a status estimation model to which an extended Kalman filter has been applied. The equations (e11-e15) of FIG. 6b represent mathematical equations for calculating variables associated with the system model of a Kalman filter. These variables may be defined by a user, or may be defined by a system to which the extended Kalman filter is applied.

In operation S110, the voltage estimating circuit (230) of FIG. 2 may receive, from the voltage measuring circuit (210) of FIG. 2 and the current measuring circuit (220) of FIG. 2, information on voltage ($V_{k-1}$) and current ($I_{k-1}$) at a first time.

In operation S120, the voltage estimating circuit (230) may, based on [Mathematical Equation 2] described with reference to FIG. 4, time-update the voltage ($V_{k-1}$) and current ($I_{k-1}$), to calculate a predicted voltage ($V_k'$). Time-update refers to entering input values (specifically voltage ($V_{k-1}$) and current ($I_{k-1}$)) of a past time to calculate result values (specifically, voltage ($V_{k-1}$) and current ($I_{k-1}$)) of a current time. The predicted voltage ($V_k'$) may be the voltage of a battery cell (B1) at a second time as preliminarily predicted by the voltage estimating circuit (230). [Mathematical Equation 2] may correspond to the first equation (e1) at the time-update step illustrated in FIG. 6a.

In operation S130, the voltage estimating circuit (230) may measurement-update the predicted voltage ($V_k'$). Measurement-update refers to inputting a measurement value (specifically, current ($I_k$)) for the current time to revise a predicted voltage ($V_k'$). The voltage estimating circuit (230), by measurement-updating the predicted voltage ($V_k'$), may finally calculate an estimated voltage ($V_{fk}'$). The estimated voltage ($V_{fk}'$) may be the voltage of a battery cell (B1) at a second time as estimated by a voltage estimating circuit (230).

In operation S140, the voltage estimating circuit (230) may calculate an error covariance. The error covariance may be calculated based on equation (e6) disclosed in FIG. 6a. The error covariance may be a measure of how accurate the estimated voltage ($V_{fk}'$) is. The voltage estimating circuit (230) may, based on the error covariance, repeatedly time-update and measurement-update to increase the accuracy of the estimated voltage ($V_{fk}'$).

In operation S150, in a case where it is determined that the accuracy of the estimated voltage ($V_{fk}'$) is sufficiently high, the voltage estimating circuit (230) may output information on the estimated voltage ($V_{fk}'$) to the sampling circuit (240).

Figure 7:
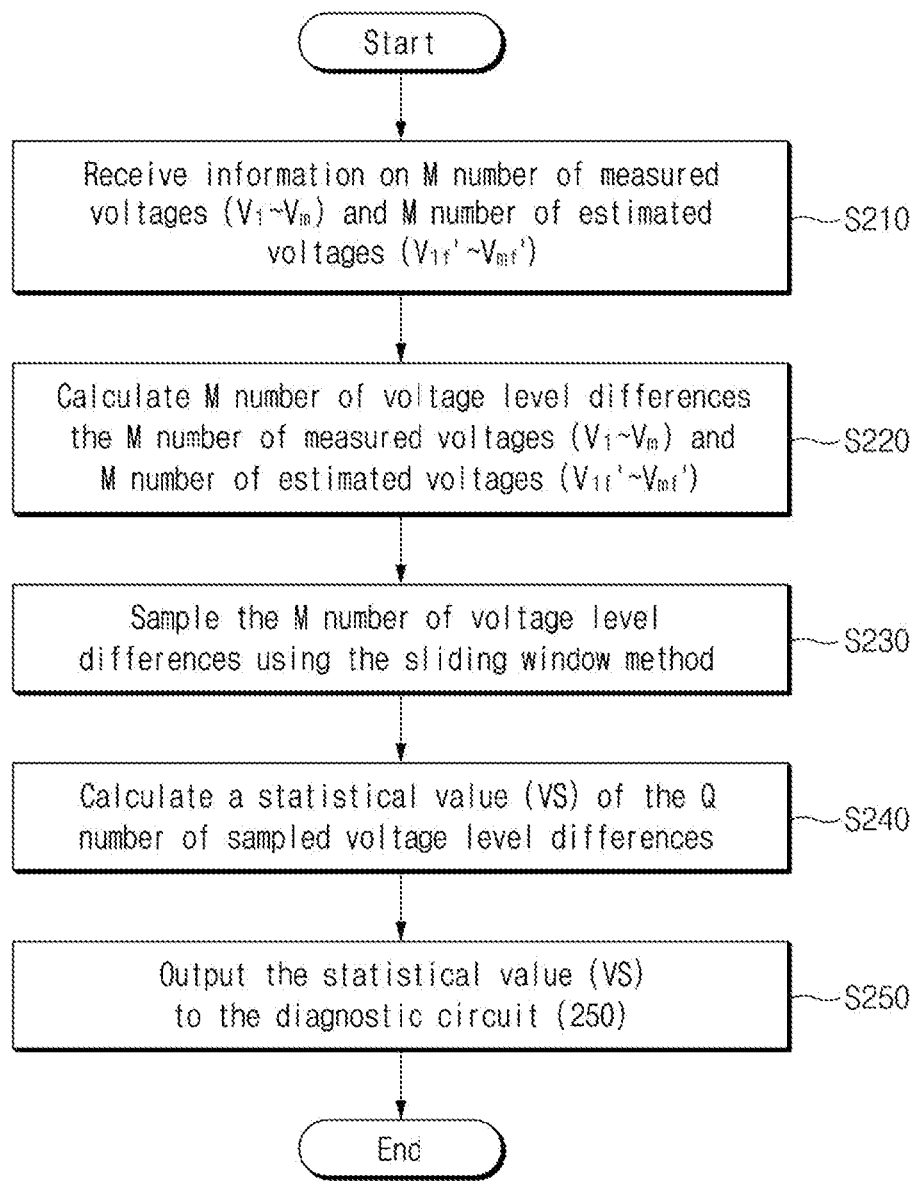
FIG. 7 is a flow diagram for describing the operation of the sampling circuit of FIG. 2.

FIG. 7 is a flow diagram for describing the operation of the sampling circuit of FIG. 2.

As described with reference to FIG. 2, the voltage measuring circuit (210) and current measuring circuit (220) of FIG. 2 may measure the voltage and current of a battery cell (V1) at regular intervals. In the following descriptions, it is assumed that the voltage measuring circuit (210) and current measuring circuit (220) have respectively measured the voltage and current of the battery cell (V1) M number of times. The voltage estimating circuit (230) may, in correspondence thereto, deduce M number of estimated voltages.

Therefore, in operation S210, the sampling circuit (240) of FIG. 2 may receive, from the voltage measuring circuit (210), information on M number of measured voltages ($V_1$-$V_m$). Further, the sampling circuit (240) may, from the voltage estimating circuit (230), receive information on M number of estimated voltages ($V_{1f}'$-$V_{mf}'$).

In operation S220, the sampling circuit (240) may calculate voltage level differences between M number of measured voltages ($V_1$-$V_m$) and M number of estimated voltages ($V_{1f}'$-$V_{mf}'$). For example, the sampling circuit (240) may calculate a voltage level difference between a voltage ($V_k$) and an estimated voltage ($V_{kf}'$).

In operation S230, the sampling circuit (240) may, using the sliding window method, sample M number of voltage level differences. The sliding window method may be a method wherein representative values are selected from at least two overlapping windows in a data dimension. For example, it may be a method wherein a representative value is selected based on a certain criterion from among input data collected in a first time interval (t1-t3) in the time dimension, then representative values are selected based on the same certain criterion from among input data collected in a second time interval (t2-t4) which overlaps partially with the first time interval. That is, the sampling circuit (240) may, using the sliding window method, select, from among M number of voltage level differences, select Q number of voltage level differences. "Q" is a natural number smaller than "M". Provided, that the present invention is not limited hereto, and the sampling circuit (240) may, using a fixed window method, sample M number of voltage level differences.

In operation S240, the sampling circuit (240) may calculate a statistical value (VS) of the Q number of sampled voltage level differences. For example, the statistical value (VS) of the Q number of voltage level differences may be one of the mean value, maximum value, minimum value, and standard deviation, etc., of the Q number of voltage level differences.

In operation S250, the sampling circuit (240) may output a statistical value (VS) to the diagnostic circuit (250).

Figure 8:
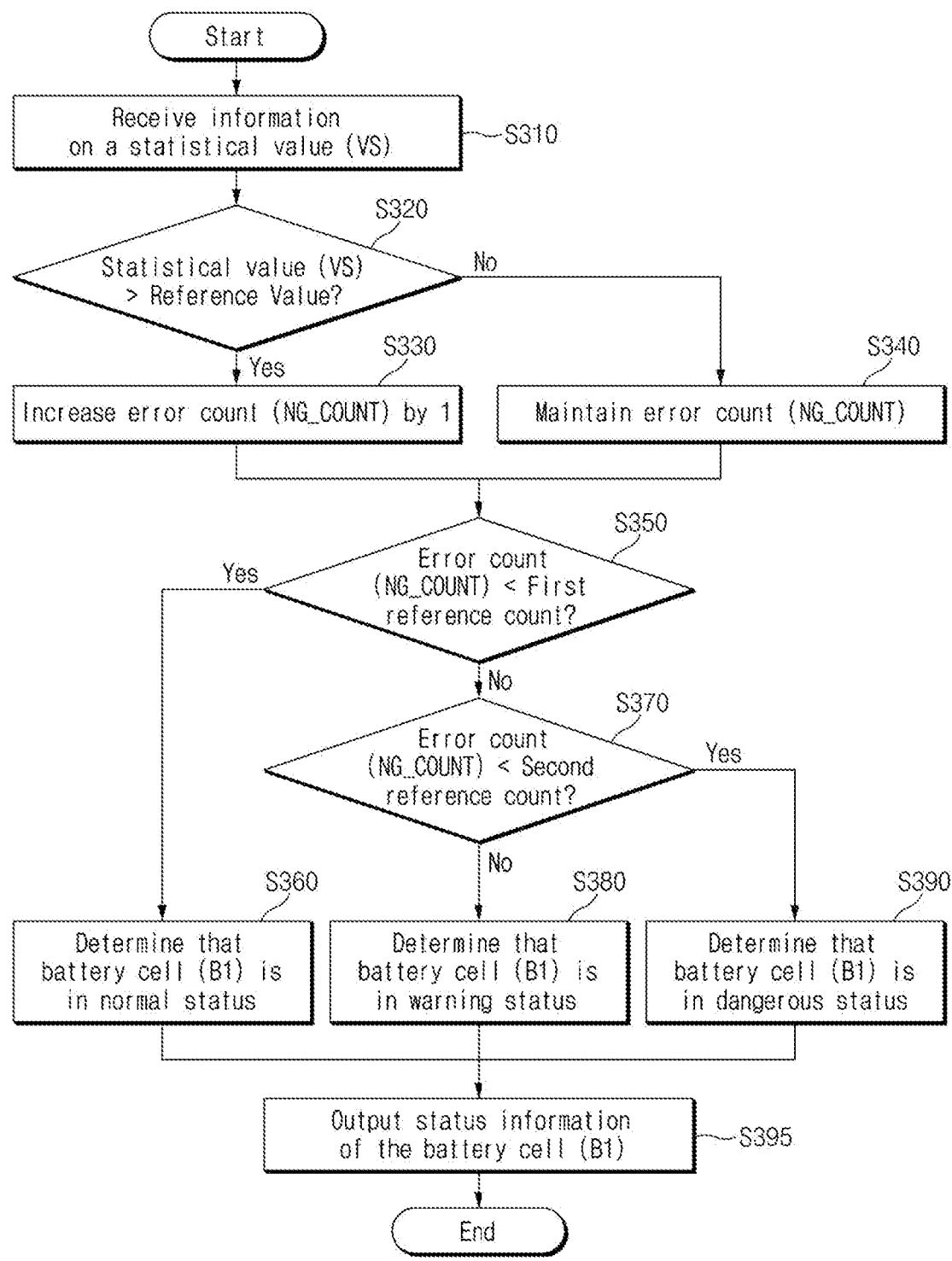
FIG. 8 is a flow diagram for describing the operation of the diagnostic circuit of FIG. 2.

FIG. 8 is a flow diagram for describing the operation of the diagnostic circuit of FIG. 2.

In operation S310, the diagnostic circuit (250) may receive a statistical value (VS) from the sampling circuit (240).

In operation S320, the diagnostic circuit (250) may compare the statistical value and a reference value. The reference value may vary depending on the temperature of the battery cell (B1) of FIG. 2. The reference value may be deduced from [Mathematical Equation 3] below.

$$Thr1 = f(temp) \times Thr0 \qquad \text{[Mathematical Equation 3]}$$

In [Mathematical Equation 3], "Thr1" represents a reference value, "Thr0" represents a constant, and f(temp) represents a function value which varies depending on the temperature of the battery cell (B1).

In the system model of the present invention, mathematical equation (e14) of FIG. 6b may be represented as [Mathematical Equation 4].

$$Q_w = \begin{bmatrix} \sigma_{SOC}^2 & 0 \\ 0 & \sigma_{V_k}^2 \end{bmatrix} \qquad \text{[Mathematical Equation 4]}$$

"$Q_w$" is a variable of the system model, and "$\sigma_{soc}^2$" and "$\sigma_{vk}^2$" represent the spread of voltage (OCV(SOC)) and the spread of voltage ($V_k$). Referring to mathematical equation (e2) of FIG. 6a, the predicted voltage ($V_k'$) varies depending on the variable ($Q_w$), and the spread of voltage (OCV(SOC)) ($\sigma_{soc}^2$) and the spread of voltage ($V_k$), ($\sigma_{vk}^2$) vary depending on temperature. The function value (f(temp)) may be determined according to the amount change in the spread of voltage ($V_k$), ($\sigma_{vk}^2$) according to temperature. For example, the function value (f(temp)) may be determined to be proportional to the amount change in the spread of voltage ($V_k$), ($\sigma_{vk}^2$) according to temperature. Further, the function value (f(temp)) may be determined by a user to increase in a case where the temperature of the battery cell (B1) increases, and to decrease in a case where the temperature of the battery cell (B1) decreases. That is, the reference value may increase in a case where the temperature of the battery cell (B1) increases, and decrease in a case where the temperature of the battery cell (B1) decreases.

In a case where the statistical value (VS) is greater than the reference value, operation S330 may be carried out. In S330, the diagnostic circuit (250) may determine that an error has occurred at battery cell (B1). In this case, the diagnostic circuit (250) may increase the error count (NG_count) of the battery cell (B1) by 1.

In a case where the statistical value (Vs) is equal to or less than the reference value, operation S340 may be carried out. In operation S340, the diagnostic circuit (250) may determine that an error has not occurred in the battery cell (B1). In such case, the diagnostic circuit (250) may retain the error count (NG_count) of the battery cell (B1) as is.

In operation S350, the diagnostic circuit (250) may compare the error count (NG_count) against a first reference count.

In a case where the error count (NG_count) is less than the first reference count, operation S360 may be carried out. In operation S360, the diagnostic circuit (250) may determine that the battery cell (B1) is in normal status.

In a case where the error count (NG_count) is equal to or greater than the first reference count, operation S370 may be carried out. In operation S370, the diagnostic circuit (250) may compare the error count (NG_count) against a second reference count. The second reference count may be greater than the first reference count.

In a case where the error count (NG_count) is less than the second reference count, operation S380 may be carried out. In operation S380, the diagnostic circuit (250) may determine that the battery cell (B1) is in a warning status.

In a case where the error count (NG_count) is greater than the second reference count, operation S390 may be carried out. In operation S390, the diagnostic circuit (250) may determine that the battery cell (B1) is in a dangerous status.

In operation S395, the diagnostic circuit (250) may output a status information of the battery cell (B1). The diagnostic circuit (250) may output the status information of the battery cell (B1) to a controller which is internal or external to the battery pack (10) of FIG. 2. For example, the diagnostic circuit (250) may output information on the status of the battery cell (B1) to the control circuit (260) of FIG. 2.

Figure 9:
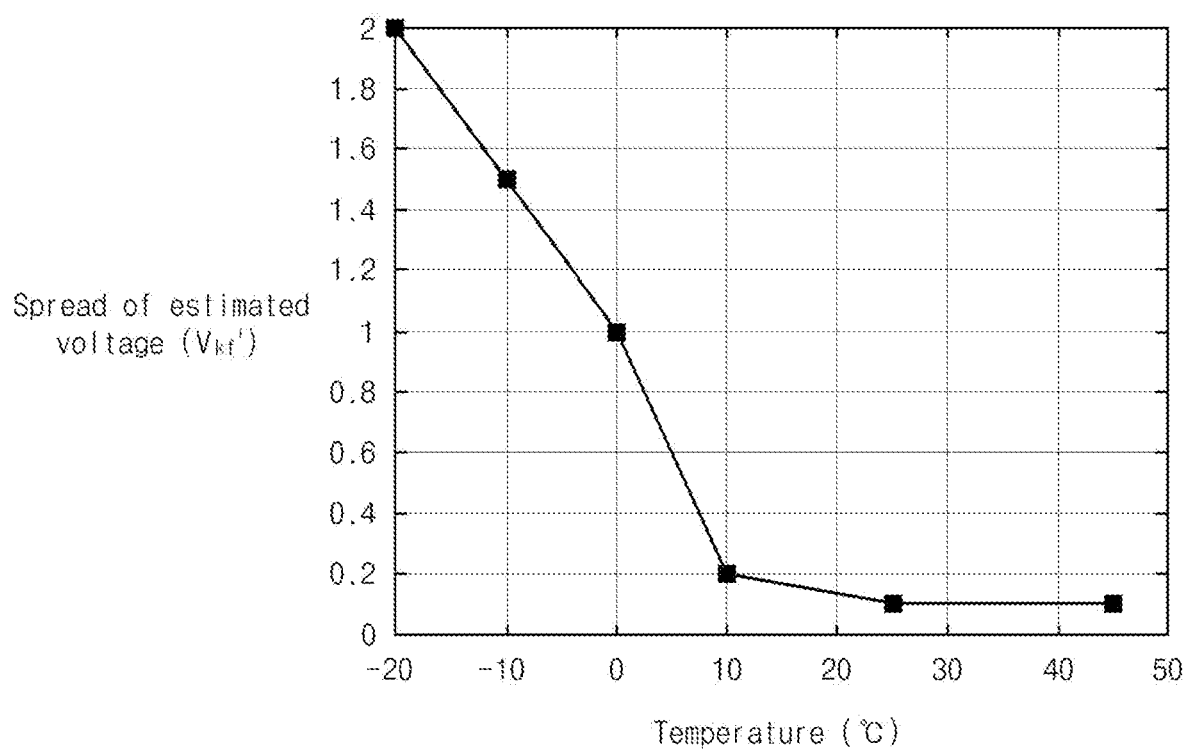
FIG. 9 is a graph illustrating a change in estimated voltage according to battery cell temperature.

FIG. 9 is a graph illustrating a change in estimated voltage according to battery cell temperature.

The x axis of the graph represents the temperature (° C.) of the battery cell (B1) of FIG. 2, and the Y axis represents the spread of the estimated voltage ($V_{fk}'$). Referring to FIG. 9, in a case where the temperature of the battery cell (B1) is −20° C., the spread of the estimated voltage ($V_{fk}'$) is 2, and at a battery cell (B1) temperature of −10° C., the spread of the estimated voltage ($V_{fk}'$) is 1.5. That is, the higher the temperature of the battery cell (B1), the smaller the spread of the estimated voltage ($V_{fk}'$). This means that the higher the temperature of the battery cell (B1), the higher the estimation accuracy for the estimated voltage ($V_{fk}'$).

The control circuit (260) of FIG. 2 may, based on this tendency, adjust a reference value. In [Mathematical Equation 3] described in the above, the function value (f(temp)) may be a formula which represents the relationship between the temperature of the battery cell (B1) and the spread of the estimated voltage ($V_{fk}'$) as illustrated in the graph of FIG. 9. Specifically, in some temperature ranges (−20° C.-10° C.), the change in the function value (f(temp)) may be large, and in some temperature ranges (10° C.-40° C.), the change in the function value (f(temp)) may be smaller.

Figure 10:
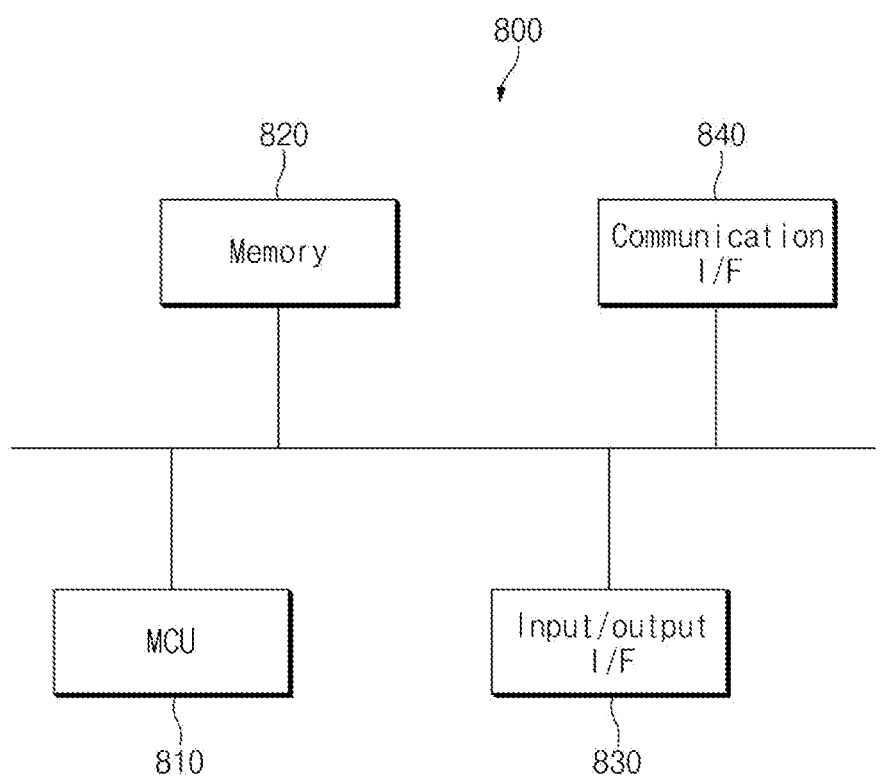
FIG. 10 is a drawing illustrating the hardware configuration of the apparatus for diagnosing a battery according to one embodiment of the present invention.

FIG. 10 is a drawing illustrating the hardware configuration of the apparatus for diagnosing a battery according to one embodiment of the present invention.

Referring to FIG. 10, the apparatus for diagnosing a battery (800) may be equipped with a microcontroller unit (MCU; 810) which is responsible for processing and controlling the respective elements, a memory (820) on which an operating system program and various programs (for example, a battery diagnostic program and a voltage approximation formula generating program, etc.), an I/O interface which provides input interfacing and output interfacing between battery cell modules and/or semiconductor switching elements, and a communication interface (840) which is able to communicate externally through wired or wireless communication networks. As such, the computer program according to the present invention may be recorded on a memory (820) and processed by a micro controller (810), and thereby by realized in the form of modules which carry out the respective functional blocks illustrated in FIG. 2.

Specific embodiments for carrying out the present invention have been described in the foregoing. The present invention includes not only the above-described embodiments, but also other embodiments which can be readily arrived at through simple design modifications. Further, the present invention also includes art which can be readily carried out in a modified form using the embodiments. Therefore, the scope of the present invention shall not be limited to the embodiments described above, and shall be defined not only by the appended claims but also their equivalents.

The invention claimed is:

1. An apparatus for diagnosing a battery, the apparatus comprising:
    a voltage measuring circuit configured to measure a voltage across both terminals of a battery cell;
    a current measuring circuit configured to measure a current flowing at either terminal of the battery cell;
    a voltage estimation circuit configured to calculate an estimated voltage level based on the measured current and a status estimation model;
    a diagnostic circuit configured to:
        calculate a voltage level difference between a voltage level of the measured voltage and the estimated voltage level, and,
        determine whether or not an error has occurred in the battery cell based on a comparison of the calculated voltage level difference and a reference value; and,
    a control circuit configured to:
        adjust the reference value according to an estimation accuracy, wherein the estimation accuracy is based on a difference between the estimated voltage levels calculated by the voltage estimation circuit at different time points of charging the battery; and
        control the battery according to an output of the diagnostic circuit.

2. The apparatus of claim 1, wherein the status estimation model is a recursive filter model based on an extended Kalman filter.

3. The apparatus of claim 1, wherein the diagnostic circuit is configured to determine that an abnormal voltage drop phenomenon has occurred in the battery cell in response to a momentary decrease in voltage across the terminals of the battery cell during charging of the battery cell.

4. The apparatus of claim 1, wherein:
    the diagnostic circuit is configured to determine whether or not the error has occurred in the battery cell based on a comparison between the voltage level difference and the reference value;

wherein the control circuit is configured to:
reduce the reference value in response to an increase in the estimation accuracy; and
increase the reference value in response to a decrease in the estimation accuracy, wherein the estimation accuracy decreases as a spread of the estimated voltage level increases.

5. The apparatus of claim 1, wherein the control circuit is configured to:
reduce the reference value in response to an increase in a temperature of the battery cell; and
increase the reference value in response an a decrease in the temperature of the battery cell.

6. The apparatus of claim 5, wherein the control circuit is configured to adjust the reference value according to:

$$Thr1 = f(temp) \times Thr0$$

wherein "Thr1" is the reference value, "f(temp)" is a function value which varies according to the temperature of the battery cell, and "Thr0" is a predetermined constant.

7. The apparatus of claim 1, wherein:
the voltage measuring circuit is configured to measure the voltage a plurality of times and obtain information at a plurality of voltage levels;
the current measuring circuit is configured to measure the current a plurality of times and obtain information at a plurality of current levels;
the voltage estimating circuit is configured to calculate a plurality of estimated voltage levels based on the plurality of current levels and the status estimation model; and,
the diagnostic circuit is configured to:
calculate a plurality of voltage level differences based on the voltage levels of plurality of measured voltages and the plurality of estimated voltage levels;
sample from the plurality of voltage level differences;
compare a statistical value of the sampled voltage level differences and the reference value; and
diagnose whether or not the battery cell is faulty based on the comparison.

8. The apparatus of claim 7, wherein the diagnostic circuit is configured to sample from the plurality of voltage level differences using a sliding window method.

9. The apparatus of claim 7, wherein the statistical value is one of: a mean value of the plurality of voltage level differences, a maximum value of the plurality of voltage level differences, a minimum value of the plurality of voltage level differences, or a standard deviation of the plurality of voltage level differences.

10. The apparatus of claim 1, wherein the measured current is input into the battery cell.

11. The apparatus of claim 1, wherein the status estimation model is configured such that a spread of the calculated estimated voltage levels increases as a temperature of the battery increases.

12. A method for diagnosing a battery, the method comprising:
measuring, by an apparatus, a voltage across both terminals of a battery cell at each of a first time and a second time later than the first time;
measuring, by the apparatus, a current flowing through either terminal of the battery cell at the first time and the second time;
calculating, by the apparatus, an estimated voltage level at the second time based on the voltage measured at the first time, the current measured at the first time, the current measured at the second time, and a status estimation model; and,
diagnosing, by the apparatus, whether or not the battery cell is faulty based on a comparison of a voltage level difference between the voltage measured at the second time and the estimated voltage level, and a reference value determined according to an estimation accuracy of the estimated voltage level, wherein the estimation accuracy corresponds to a difference between the estimated voltage levels calculated by the voltage estimation circuit at different time points of charging the battery; and
controlling, by the apparatus, the battery according to an output of the diagnostic circuit.

13. The method of claim 12, wherein:
calculating the estimated voltage level is based on a status estimation model to which an extended Kalman filter has been applied, wherein the extended Kalman filter is based on a Thevenin equivalent circuit that reflects voltage-current characteristics of the battery cell.

14. The method of claim 13, wherein calculating the estimated voltage level further comprises:
determining a status variable of the extended Kalman filter based on the Thevenin equivalent circuit;
predicting the voltage across both terminals of a battery cell at the second time, based on the voltage measured at the first time and the status variable; and,
calculating the estimated voltage level based on the current measured at the second time and the predicted voltage.

15. The method of claim 12,
wherein the estimation accuracy is determined by a temperature of the battery cell, and
wherein the method further includes at least one of:
reducing the reference value in response to an increase in the temperature of the battery cell; and
increasing the reference value in response to a decrease in the temperature of the battery cell.

* * * * *